(12) United States Patent
Ahmed et al.

(10) Patent No.: US 9,562,675 B2
(45) Date of Patent: Feb. 7, 2017

(54) TWO-HIGH LIGHT-EMITTING DIODE HOLDER STRUCTURE

(71) Applicant: ILLINOIS TOOL WORKS INC., Glenview, IL (US)

(72) Inventors: Yasoob Ahmed, Bartlett, IL (US); Steven Sievers, Algonquin, IL (US)

(73) Assignee: Illinois Tool Works Inc., Glenview, IL (US)

( * ) Notice: Subject to any disclaimer, the term of this patent is extended or adjusted under 35 U.S.C. 154(b) by 406 days.

(21) Appl. No.: 14/308,649

(22) Filed: Jun. 18, 2014

(65) Prior Publication Data
US 2015/0369458 A1    Dec. 24, 2015

(51) Int. Cl.
*F21V 19/00*    (2006.01)
*F21V 23/00*    (2015.01)
*F21V 23/06*    (2006.01)
*H05K 3/30*     (2006.01)
*F21W 111/00*   (2006.01)
(Continued)

(52) U.S. Cl.
CPC ............ *F21V 19/002* (2013.01); *F21V 23/005* (2013.01); *F21V 23/06* (2013.01); *H05K 3/301* (2013.01); *F21W 2111/00* (2013.01); *F21Y 2101/00* (2013.01); *H05K 1/181* (2013.01); *H05K 3/308* (2013.01); *H05K 3/3421* (2013.01); *H05K 2201/0311* (2013.01); *H05K 2201/10106* (2013.01); *H05K 2201/10606* (2013.01); *H05K 2201/10651* (2013.01); *H05K 2201/10757* (2013.01)

(58) Field of Classification Search
CPC ...... F21V 19/002; F21V 23/005; F21V 23/06; H05K 3/301; H05K 1/181; H05K 3/308; H05K 3/3421; H05K 2201/0311; H05K 2201/10106; H05K 2201/10606; H05K 2201/10651; H05K 2201/10757
USPC ........................................................ 362/382
See application file for complete search history.

(56) References Cited

U.S. PATENT DOCUMENTS 4,065,198 A * 12/1977 Jordan ..................... H05K 7/12
                                                        439/56
4,534,604 A * 8/1985 Peterson ................ H05K 3/301
                                                        439/78
(Continued)

FOREIGN PATENT DOCUMENTS

JP         H01 293594 A    11/1989

*Primary Examiner* — Bryon T Gyllstrom
(74) *Attorney, Agent, or Firm* — McAndrews, Held & Malloy, Ltd.

(57) ABSTRACT

A holder structure for mounting light indicators on printed circuit boards using surface mount technology at a position elevated above the surface of the board is provided with a body member including a top wall, a bottom wall, opposed sidewalls, a front wall, and a rear wall, all being formed integrally together. Two spaced-apart recesses are formed and aligned vertically in the front wall of the body member terminating in respective first and second interior wall portions. The first interior wall portion has openings formed on diametrically opposed sides of a vertical partition and lying in a horizontal plane parallel to the bottom wall. The second interior wall portion has openings formed on diametrically opposed sides of a transverse partition and lying in a plane which is rotated a predetermined number of degrees from a vertical plane perpendicular to the bottom wall.

20 Claims, 5 Drawing Sheets

(51) Int. Cl.
 *H05K 1/18* (2006.01)
 *H05K 3/34* (2006.01)
 *F21Y 101/00* (2016.01)

(56) References Cited

U.S. PATENT DOCUMENTS

| | | | | |
|---|---|---|---|---|
| 4,739,139 | A * | 4/1988 | Ikeda | H01H 23/006 200/284 |
| 4,935,856 | A * | 6/1990 | Dragoon | B60Q 1/2696 362/307 |
| 4,990,108 | A * | 2/1991 | Sakaguchi | H01R 13/64 439/56 |
| 5,121,311 | A * | 6/1992 | Cheselske | H05K 3/301 362/240 |
| 5,396,086 | A * | 3/1995 | Engels | H01L 33/62 257/43 |
| 7,089,657 | B1 | 8/2006 | Masumoto | |
| 2007/0063323 | A1 | 3/2007 | Lee et al. | |
| 2008/0293270 | A1* | 11/2008 | Gisler | H01R 12/585 439/82 |
| 2010/0328918 | A1 | 12/2010 | Yang et al. | |
| 2011/0147785 | A1 | 6/2011 | Kim | |

* cited by examiner

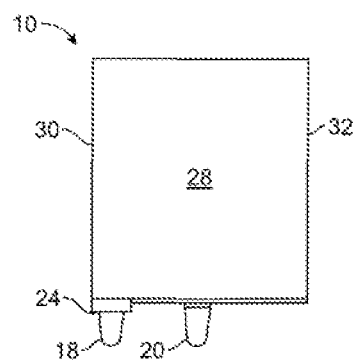
FIG. 10
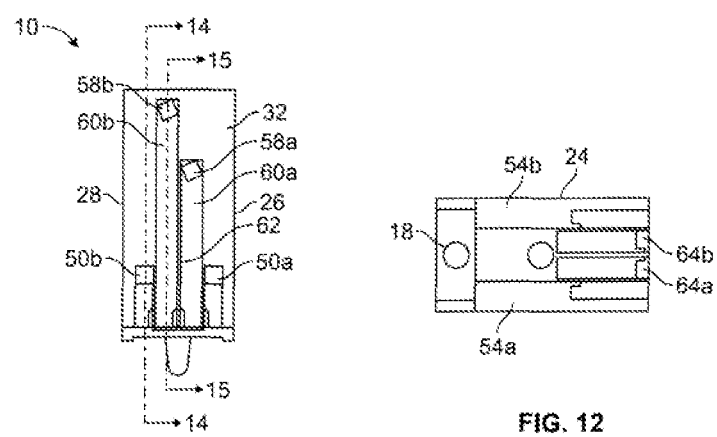
FIG. 11     FIG. 12

TWO-HIGH LIGHT-EMITTING DIODE HOLDER STRUCTURE

BACKGROUND OF THE INVENTION

1. Field of the Invention

This invention relates generally to indicator apparatuses or structures for mounting indicator lights on printed circuit boards. More particularly, it relates to a holder structure for mounting light-emitting diodes (LEDs) on printed circuit boards (PCBs) using "surface mount technology" (SMT).

2. Description of the Prior Art

As is generally known to those skilled in the art, light-emitting diodes (LEDs) are particularly useful as status indicators for various types of electrical circuits and systems, such as in different kinds of proximity sensors for detecting the presence or absence of an object. For example, one or more LEDs may be mounted at a sensor housing so as to provide desired information about the operating condition of the sensor at the housing. The LEDs are very advantageous in this type of operating environment due to the fact that they are small in size and are relatively inexpensive in cost. Further, they consume small amounts of power and have a long useful life.

The LEDs are available commercially from a variety of suppliers which permit direct mounting to a printed circuit board (PCB) via a plurality of eyelets or "through-holes". However, since the printed circuit board is typically mounted within a chassis of some type the LEDs mounted on the PCB are not usually viewable directly by a user of an electrical system. Heretofore, light pipes consisting of rods or bundles of fibers made of clear plastic or glass have been designed to direct the light from the LEDs to openings formed on, for example, the face or front panel of the electrical system where they may be viewed by the user.

In complex electrical and electronic devices, it is not uncommon that there are used a number of printed circuit boards each having a substantial quantity of circuit components, such as integrated circuit chips, resistors, capacitors, and the like. In view of the advances made in the PCB technology in recent years, the prior art method of mounting the various circuit components on the PCB via eyelets or "through-holes" for making electrical interconnections have been largely replaced by printed circuit boards using "surface mount technology" (SMT). The "wave soldering" technique utilized in the PCBs having "through-holes" is no longer used and have been superceded by radiant or convention heating in an oven for SMT printed circuit boards where the electrical components and their leads are heated so as to cause the pre-applied solder to melt and attach the components to the boards via solder pads.

If the individual LEDs were directly mounted on the SMT printed circuit boards using the "through-holes", there would be encountered a number of disadvantages associated with this technique. Firstly, the SMT printed circuit board would be required to be modified with such "through-holes" in order to accommodate the individual LEDs. Secondly, after the use of radiant heating for securing the other electrical components to the board another step would be needed to secure the individual LEDs to the board by way of "wave soldering". These required extra steps are very expensive and would thus increase the manufacturing and assemble cost of the boards.

In addition, even if the individual LEDs could be mounted economically on the SMT printed circuit boards they would be typically required to be elevated above the board so as to be visible to a user. However, the conductive leads usually provided for the individual LEDs tend to be very pliable and narrow so as to be unable to support and accurately locate them very high off the board or near the edge of the board. Therefore, the use of the advanced surface mount technology has created a demand for structures and techniques for mounting and positioning indicator lights, i.e., LEDs, on PCBs using SMT with strength and accuracy.

Accordingly, it would be desirable to provide a holder structure for mounting indicator lights, particularly LEDs, on printed circuit boards using surface mount technology with strength and accuracy. It would be expedient that the holder structure includes a housing being capable of mounting two-high LEDs one disposed above the other for attachment to conductive solder pads on a SMT printed circuit board with a high degree of mechanical strength and precision.

BRIEF SUMMARY OF THE INVENTION

The foregoing demands are met, in accordance with the invention, by the provision of a two-high light-emitting diode holder structure for mounting LEDs on printed circuit boards using "surface mount technology" which overcomes all of the disadvantages of the prior art.

In accordance with one aspect of the present invention, a two-high holder structure for mounting indicator lights on printed circuit boards using surface mount technology is provided wherein the indicator lights are positioned a substantial distance above the board and/or near the edge thereof so as to be easily viewed by a user.

In accordance with another aspect of the present invention, there is provided a two-high holder structure for mounting indicator lights on printed circuit boards using surface mount technology with a high degree of mechanical strength and accuracy.

In accordance with still another aspect of the present invention, a two-high holder structure for mounting indicator lights on printed circuit boards using surface mount technology is provided which is relatively simple in its construction and is economical to manufacture and assemble.

In accordance with yet still another aspect of the present invention, a two-high holder structure for mounting light-emitting diodes on printed circuit boards using surface mount technology is provided which is characterized by a design having a small profile and made of durable material.

In a preferred embodiment of the present invention, there is provided a holder structure for mounting light indicators on printed circuit boards using surface mount technology at a position elevated above the surface of the board which includes a body member having a top wall, a bottom wall, opposed sidewalls, a front wall, and a rear wall, all being formed integrally together. Two spaced-apart recesses are formed and aligned vertically in the front wall of the body member terminating in respective first and second interior wall portions.

A vertical partition is disposed in an intermediate area of the first interior wall portion which is perpendicular to the horizontal plane of the bottom wall. The first interior wall portion is provided with first and second openings formed on diametrically opposed sides of the vertical partition. The first and second openings extend from the first interior wall portion to the rear wall and lies in a horizontal plane parallel to the horizontal plane of the bottom wall.

A transverse partition is disposed in an intermediate area of the second interior wall portion which is positioned angularly to the horizontal plane of the bottom wall. The second interior wall portion is provided with third and fourth openings formed on diametrically opposed sides of the transverse partition. The third and fourth openings extend from the second interior wall portion to the rear wall and lies in a plane which is rotated a predetermined number of degrees from a vertical plane perpendicular to the horizontal plane of the bottom wall.

In order to accomplish the foregoing and related aspects, the invention comprises the features hereinafter fully described and particularly pointed out in the appended claims. The following description and the annexed drawings set forth in the detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 10 is a side elevational view, similar to FIG. 4, of the holder structure of FIG. 7;

FIG. 11 is a rear end view of the holder structure of FIG. 7;

FIG. 12 is a bottom view of the holder structure of FIG. 7;

DETAILED DESCRIPTION OF THE INVENTION

Figure 1:
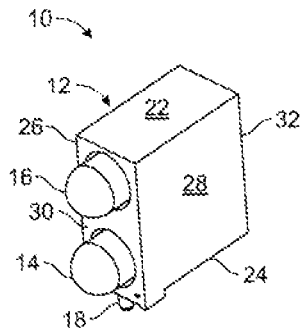
FIG. 1 is a perspective view of a two-high LED holder structure in its fully assembled condition, constructed in accordance with the principles of the present invention.

Before explaining at least one embodiment of the invention, it is to be distinctly understood at the outset that the present invention shown in the drawings and described in detail in conjunction with the preferred embodiments is not intended to serve as a limitation upon the scope or teachings thereof, but is to be considered merely as an exemplification of the principles of the present invention.

As such, those skilled in the art will appreciate that the conception upon which this disclosure is based may readily be utilized as a basis for the designing of other structures, methods and systems for carrying the several purposes of the present invention. It is important, therefore, that the claims be regarded as including such equivalent constructions insofar as they do not depart from the spirit and scope of the present invention.

The invention will now be described with reference to the figures in the accompanying drawings, in which like reference numerals indicate corresponding like parts, elements, components, steps, and processes throughout. Referring now in detail to FIGS. 1 through 6 of the drawings, there is depicted an embodiment of two-high LED holder structure 10, constructed in accordance with the principles of the present invention. In particular, the illustrated holder structure is used to house two light-emitting diodes one disposed above the other one for attachment to conductive solder pads on a surface mount printed circuit board with a high degree of mechanical strength and accuracy.

As illustrated in FIGS. 1-6, the holder structure 10 includes a generally rectangularly-shaped body member 12, two indicator lights such as light-emitting diodes 14 and 16 one disposed or stacked above the other one, and a pair of legs 18 and 20. The body member is preferably fabricated by an injection molding of a high temperature-resistant plastic-like material, such as thermoplastic resin. However, it should be clearly understood by those skilled in the art that any suitable material may be employed to form the body member as long as such material is structurally and dimensionally stable when it is subjected to the high temperatures used in radiant heating of the SMT printed circuit board assemblies so as to make the desired soldered connections.

Figure 7:
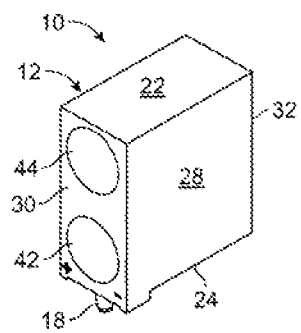
FIG. 7 is a perspective view, similar to FIG. 1, of the two-high LED holder structure, but with the two LEDs being removed.
Figure 8:
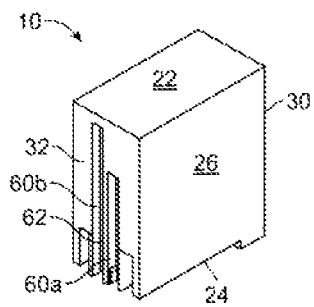
FIG. 8 is another perspective view of the holder structure of FIG. 1, illustrating the rear wall member thereof.
Figure 9:
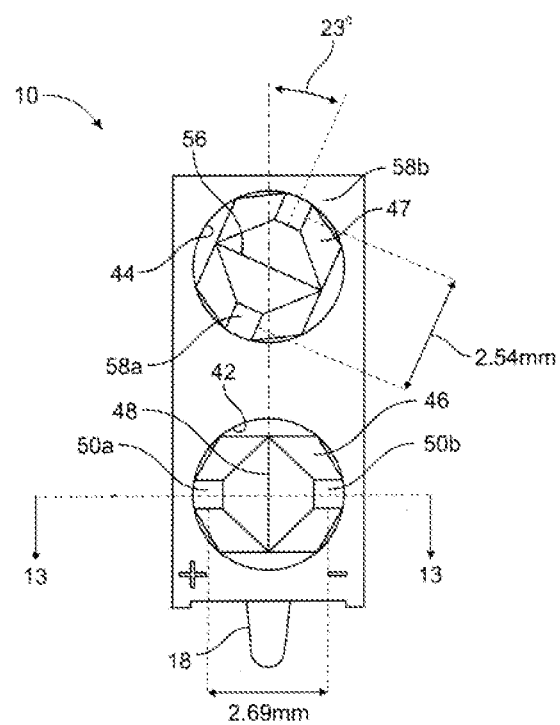
FIG. 9 is a front end view, similar to FIG. 3, but with the two LEDs being removed.
Figure 13:
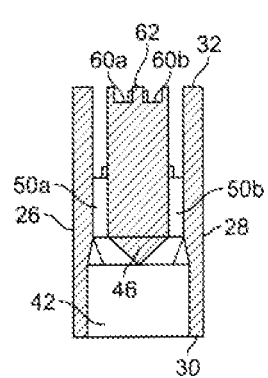
FIG. 13 is a cross-sectional view of the holder structure of FIG. 7, with the section being taken along the lines 9-9 of FIG. 9.
Figure 14:
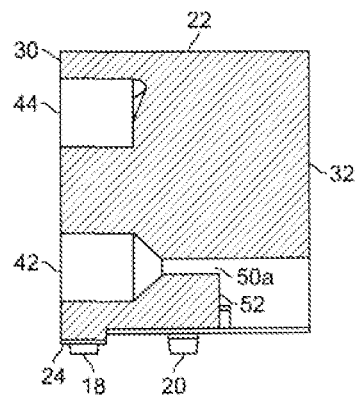
FIG. 14 is a cross-sectional view of the holder structure of FIG. 7, with the section being taken along the lines 14-14 of FIG. 11.
Figure 15:
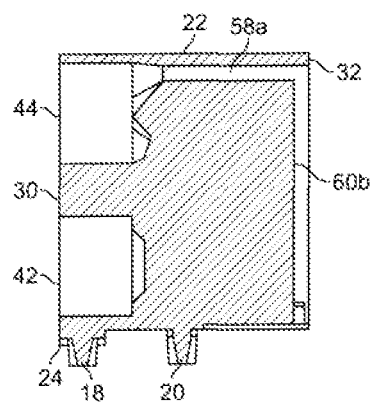
FIG. 15 is a cross-sectional view of the holder structure of FIG. 7, with the section being taken along the lines 15-15 of FIG. 11.

The body member 12 includes a top wall 22, a bottom wall 24, opposed sidewalls 26 and 28, a front wall 30 and rear wall 32, all being formed integrally together. The bottom LED device 14 with its lens and the top LED device 16 with its lens are both located in respective recesses 42, 44 in the body member 12 (see FIGS. 7 and 9). The legs 18 and 20 are both extending downwardly from the bottom wall 24 of the body member 12. The legs are adapted to mate and fit into corresponding holes or apertures 36 formed in the SMT printed circuit board 38 (FIG. 5).

Figure 6:
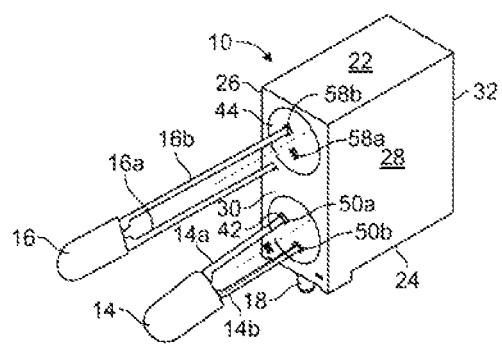
FIG. 6 is an exploded, perspective view of the holder structure of FIG. 1, with some details being omitted for sake of clarity.

As can be best seen from FIG. 6, the bottom LED 14 is formed with a pair of relatively short, narrow conductive leads 14a and 14b which are substantially equal in length. The top LED 16 is also formed with a pair of conductive leads 16a and 16b. The lead 16a is slightly shorter in length than the lead 16b. However, the lead 16a of the top LED 16 is still somewhat longer than the leads 14a and 14b of the bottom LED 14. Each of the LEDs are conventional miniature type light-emitting diodes which are manufactured and sold by a number of different companies.

By way of example, each of the LEDs 14 and 16 may be used to indicate a different operating condition of a sensor system (not shown) in which the holder structure 10 is employed. One of the LEDs may emit a green colored light when lit, such as to indicate that the system is operating in the proper condition. The other one of the LEDs may emit a red colored light when lit, such as to indicate that a malfunction has occurred in the system. It should be appreciated that the green and red colored lights as described are for purpose of clarity of explanation, as any other different colored lights as desired by a user, may be associated with the LEDs 14 and 16.

Figure 2:
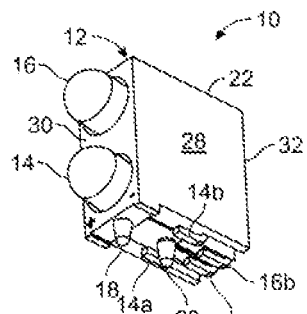
FIG. 2 is another perspective view of the holder structure of FIG. 1, illustrating the underneath side thereof.
Figure 3:
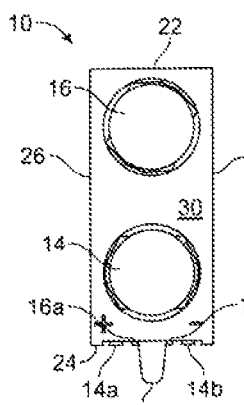
FIG. 3 is front end view of the holder structure of FIG. 1.
Figure 4:
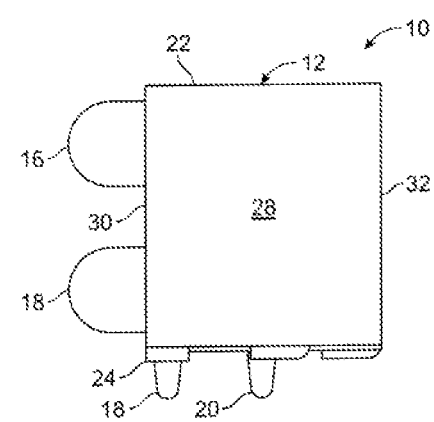
FIG. 4 a side elevational view of the holder structure of FIG. 1.
Figure 5:
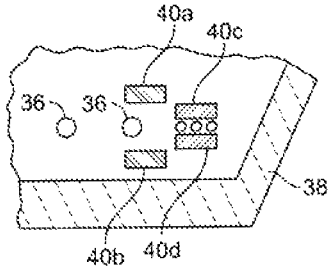
FIG. 5 is a layout of conductive solder pads formed on a SMT printed circuit board.

With attention directed to FIGS. 2 and 5, the distal ends of the leads 14a, 14b and 16a, 16b of the respective LEDs 14 and 16 are aligned and placed on corresponding solder pads 40a-40d disposed on the SMT printed circuit board 38. The pads 40a-40d have been generally pre-soldered with a thin coating of solder. Simultaneously, the legs 18 and 20 of the holder structure are fitted into the corresponding holes 36 so as to maintain the body member 12 in an accurate position elevated above the surface of the board. After all of the other electrical components have been mounted on the printed circuit board, the whole board assembly is subjected to radiant and/or convection heating in an oven to re-flow the solder on the pads to the distal ends of the LEDs leads so as to form a strong, mechanical bonding and electrical complete connection of the holder structure 10 to the electrical circuitry on the surface mount board.

With reference to FIGS. 7 through 15, the details of the construction of the body member 12 will now be described hereinbelow. The body member 12 is formed a rectangular solid with the bottom wall 24 being disposed in a horizontal plane and the top wall 22 being spaced-apart therefrom and co-planar with the bottom wall 24. The sidewalls 26 and 28 are spaced-apart and are co-planar with each other. Each of the sidewalls is disposed in vertical planes which are perpendicular to the horizontal plane of the bottom wall. Further, the sidewalls extend upwardly along the two longer side edges of the bottom wall and terminate at the top wall. The front and rear walls 30, 32 are spaced-apart and co-planar with each other. Each of the front and rear walls is likewise disposed in vertical planes which are perpendicular to the horizontal plane of the bottom wall. In addition, each of the front and rear walls extend upwardly along the two shorter edges of the bottom wall and terminate at the top wall.

As shown in FIGS. 7, 9, and 13-15, two spaced-apart cylindrically-shaped recesses 42, 44 are formed in the front wall 30 terminating in respective interior wall portions 46, 47. The interior wall portion 46 is provided in its intermediate area with a vertical partition 48 disposed perpendicularly to the horizontal plane of the bottom wall 24. On the diametrically opposed sides of the vertical partition 48, there are formed openings or holes 50a and 50b extending from the interior wall portion 46 to the rear wall 32. The distance between the center of the opening 50a and the center of the opening 50b is approximately 2.69 mm. These openings 50a, 50b lie in a horizontal plane parallel to the horizontal plane of the bottom wall 24.

The vertical partition 48 functions as a divider so to separate the conductive leads 14a and 14b from each other when the bottom LED 14 is inserted into the recess 42 with the leads extending through the respective holes 50a, 50b. The LED 14 is received within the cylindrical recess 42 so that substantially one-half of the lens thereof appears above the surface of the front wall 30 (FIGS. 1, 2, and 4) in order that its light can be easily seen by a user. After the leads 14a, 14b are inserted or pushed into the openings so as to extend beyond the rear wall, they are bent downwardly against an edge of a vertical interior wall 52 located between the openings 50a, 50b and the rear wall 32. Next, the distal ends of the leads are further bent horizontally toward the front wall 30 and come to rest adjacent to and within first opposed channels 54a, 54b formed in the bottom wall 24. (FIG. 2)

Similarly, the interior wall portion 47 is provided in its intermediate area with a transverse partition 56 disposed angularly with respect to the horizontal plane of the bottom wall 24. On the diametrically opposed sides of the transverse partition 56, there are formed openings or holes 58a and 58b extending from the interior wall portion 47 to the rear wall 32. The distance between the center of the opening 58a and the center of the opening 58b is approximately 2.54 mm. These openings 58a, 58b do not lie in a vertical plane perpendicular to the horizontal plane of the bottom wall 24, but is rotated clockwise a predetermined number of degrees, such as about twenty-three degrees, from such vertical plane in order to facilitate mounting of the leads 16a, 16b of the top LED 16. Alternatively, it should be appreciated by those skilled in the art that the plane of the openings 58a, 58b may be rotated counter-clockwise to the vertical plane.

The transverse partition 56 functions as a divider so to separate the conductive leads 16a and 16b from each other when the top LED 16 is inserted into the recess 44 with the leads extending through the respective holes 58a, 58b. The LED 16 is received within the cylindrical recess 44 so that substantially one-half of the lens thereof appears above the surface of the front wall 30 (FIGS. 1, 2, and 4) in order that its light can be easily seen by a user. After the leads 16a, 16b are inserted or pushed into the openings so as to extend beyond the rear wall, they are bent downwardly to ride in elongated vertical slots 60a, 60b formed in the rear wall 32. An elongated partition 62 is formed between the vertical slots 60a, 60b so as to maintain separation of the leads 16a, 16b. Next, the distal ends of the leads are further bent horizontally toward the front wall 30 and come to rest adjacent to and within second opposed channels 64a, 64b formed in the bottom wall 24. (FIG. 2)

From the foregoing detailed description, it can thus be seen that the present invention provides a two-high holder structure for mounting light-emitting diodes on printed circuit boards using surface mount technology wherein the LEDs are at a position elevated a substantial distance above the surface of the board and/or near the edge thereof so as to be easily viewed by a user. The present holder structure is relatively simple in its construction and is ease to manufacture and assemble. Further, the holder structure is of a compact size and made of a durable material.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

The invention claimed is:

1. A holder structure for mounting light indicators on printed circuit board using surface mount technology at a position elevated above the surface of the board, comprising: a rectangularly-shaped body
  member including a top wall, a bottom wall, opposed sidewalls, a front wall, and a rear wall, all being formed integrally together;
  said bottom wall being disposed in a horizontal plane, said top wall being spaced-apart therefrom and co-planar with said bottom wall, said sidewalls being spaced-apart and co-planar with each other, said sidewalls being disposed in vertical planes which are perpendicular to the horizontal plane of said bottom wall, said front wall being disposed spaced-apart and co-planar with said rear wall, said front and rear walls being also disposed in vertical planes which are perpendicular to the horizontal plane of said bottom wall;

two spaced-apart, cylindrically-shaped recesses being formed and aligned vertically in said front wall of said body member terminating in respective first and second interior wall portions;

a vertical partition being disposed in an intermediate area of said first interior wall portion which is perpendicular to the horizontal plane of said bottom wall, said first interior wall portion having first and second openings formed on diametrically opposed sides of said vertical partition, said first and second openings extending from said first interior wall portion to said rear wall and lying in a horizontal plane parallel to the horizontal plane of said bottom wall;

a transverse partition being disposed in an intermediate area of said second interior wall portion which is positioned angularly to the horizontal plane of said bottom wall, said second interior wall portion having third and fourth openings formed on diametrically opposed sides of said transverse partition, said third and fourth openings extending from said second interior wall portion to said rear wall and lying in a plane which is rotated a predetermined number of degrees from a vertical plane perpendicular to the horizontal plane of said bottom wall;

first and second light indicators being received in corresponding ones of said cylindrically-shaped recesses so that substantially one-half of their lens thereof appear above the surface of said front wall in order that its light can be easily seen by a user;

said first light indicator having a pair of conductive leads extending through corresponding ones of said first and second openings in said first interior wall portion; and said second light indicator having a pair of conductive leads extending through corresponding ones of said third and fourth openings in said second interior wall portion.

2. A holder structure for mounting light indicators on printed circuit boards as claimed in claim 1, wherein said first and second indicator lights are miniature type light-emitting diodes.

3. A holder structure for mounting light indicators on printed circuit boards as claimed in claim 1, wherein said body member is made of a plastic-like material.

4. A holder structure for mounting light indicators on printed circuit boards as claimed in claim 3, wherein said plastic-like material comprises a thermoplastic resin.

5. A holder structure for mounting light indicators on printed circuit boards as claimed in claim 1, wherein said vertical partition functions as a divider so to separate the conductive leads of said first indicator light.

6. A holder structure for mounting light indicators on printed circuit boards as claimed in claim 5, wherein said transverse partition functions as a divider so to separate the conductive leads of said second indicator light.

7. A holder structure for mounting light indicators on printed circuit boards as claimed in claim 1, wherein the distance between the centers of the first and second openings in said first interior wall portion is approximately 2.69 mm.

8. A holder structure for mounting light indicators on printed circuit boards as claimed in claim 7, wherein the distance between the centers of the third and fourth openings in said second interior wall portion is approximately 2.54 mm.

9. A holder structure for mounting light indicators on printed circuit boards as claimed in claim 1, wherein said distal ends of the conductive leads on said first and second indicator lights are bent and comes to rest adjacent to the surface of said bottom wall so that they can be attached to corresponding ones of solder pads disposed on the surface mount printed circuit board.

10. A holder structure for mounting light emitting diodes on printed circuit board using surface mount technology at a position elevated above the surface of the board, comprising: a rectangularly-shaped member including a top wall, a bottom wall, opposed sidewalls, a front wall, and a rear wall, all being formed integrally together;

said bottom wall being disposed in a horizontal plane, said top wall being spaced-apart therefrom and co-planar with said bottom wall, said sidewalls being spaced-apart and co-planar with each other, said sidewalls being disposed in vertical planes which are perpendicular to the horizontal plane of said bottom wall, said front wall being disposed spaced-apart and co-planar with said rear wall, said front and rear walls being also disposed in vertical planes which are perpendicular to the horizontal plane of said bottom wall;

two spaced-apart, cylindrically-shaped recesses being formed and aligned vertically in said front wall of said body member terminating in respective first and second interior wall portions;

a vertical partition being disposed in an intermediate area of said first interior wall portion which is perpendicular to the horizontal plane of said bottom wall, said first interior wall portion having first and second openings formed on diametrically opposed sides of said vertical partition, said first and second openings extending from said first interior wall portion to said rear wall and lying in a horizontal plane parallel to the horizontal plane of said bottom wall;

a transverse partition being disposed in an intermediate area of said second interior wall portion which is positioned angularly to the horizontal plane of said bottom wall, said second interior wall portion having third and fourth openings formed on diametrically opposed sides of said transverse partition, said third and fourth openings extending from said second interior wall portion to said rear wall and lying in a plane which is rotated a predetermined number of degrees from a vertical plane perpendicular to the horizontal plane of said bottom wall;

first and second light-emitting diodes being received in corresponding ones of said cylindrically-shaped recesses so that substantially one-half of their lens thereof appear above the surface of said front wall in order that its light can be easily seen by a user;

said first light-emitting diode having a pair of conductive leads extending through corresponding ones of said first and second openings in said first interior wall portion; and said second light-emitting diode having a pair of conductive leads extending through corresponding ones of said third and fourth openings in said second interior wall portion.

11. A holder structure for mounting light-emitting diodes on printed circuit boards as claimed in claim 10, wherein said body member is made of thermoplastic resin.

12. A holder structure for mounting light-emitting diodes on printed circuit boards as claimed in claim 10, wherein said vertical partition functions as a divider so to separate the conductive leads of said first light-emitting diode.

13. A holder structure for mounting light-emitting diodes on printed circuit boards as claimed in claim 12, wherein said transverse partition functions as a divider so to separate the conductive leads of said second light-emitting diode.

14. A holder structure for mounting light-emitting diodes on printed circuit boards as claimed in claim 10, wherein the distance between the centers of the first and second openings in said first interior wall portion is approximately 2.69 mm.

15. A holder structure for mounting light-emitting diodes on printed circuit boards as claimed in claim 14, wherein the distance between the centers of the third and fourth openings in said second interior wall portion is approximately 2.54 mm.

16. A holder structure for mounting light-emitting diodes on printed circuit boards as claimed in claim 10, wherein said distal ends of the conductive leads on said first and second light-emitting diodes are bent and comes to rest adjacent to the surface of said bottom wall so that they can be attached to corresponding ones of solder pads disposed on the surface mount printed circuit board.

17. A holder structure for mounting light indicators on printed circuit boards using surface mount technology at a position elevated above the surface of the board, comprising:
- a body member including a top wall, a bottom wall, opposed sidewalls, a front wall, and a rear wall, all being formed integrally together;
- two spaced-apart recesses being formed and aligned vertically in said front wall of said body member terminating in respective first and second interior wall portions;
- a vertical partition being disposed in an intermediate area of said first interior wall portion which is perpendicular to the horizontal plane of said bottom wall, said first interior wall portion having first and second openings formed on diametrically opposed sides of said vertical partition, said first and second openings extending from said first interior wall portion to said rear wall and lying in a horizontal plane parallel to the horizontal plane of said bottom wall; and
- a transverse partition being disposed in an intermediate area of said second interior wall portion which is positioned angularly to the horizontal plane of said bottom wall, said second interior wall portion having third and fourth openings formed on diametrically opposed sides of said transverse partition, said third and fourth openings extending from said second interior wall portion to said rear wall and lying in a plane which is rotated a predetermined number of degrees from a vertical plane perpendicular to the horizontal plane of said bottom wall.

18. A holder structure for mounting light indicators on printed circuit boards as claimed in claim 17, wherein said body member is made of a thermoplastic resin.

19. A holder structure for mounting light indicators on printed circuit boards as claimed in claim 17, wherein the distance between the centers of the first and second openings in said first interior wall portion is approximately 2.69 mm.

20. A holder structure for mounting light indicators on printed circuit boards as claimed in claim 19, wherein the distance between the centers of the third and fourth openings in said second interior wall portion is approximately 2.54 mm.

\* \* \* \* \*